United States Patent [19]

Davis

[11] 4,168,331

[45] Sep. 18, 1979

[54] PROCESS FOR PREPARING RESIN IMPREGNATED SUBSTRATES FOR USE IN PREPARING ELECTRICAL LAMINATES

[75] Inventor: William Davis, Lake Jackson, Tex.

[73] Assignee: The Dow Chemical Company, Midland, Mich.

[21] Appl. No.: 930,640

[22] Filed: Aug. 3, 1978

[51] Int. Cl.$^2$ .......................... B05D 5/12; B32B 27/38
[52] U.S. Cl. ...................................... 427/58; 174/68.5; 427/96; 427/386; 427/434 B; 428/413; 428/417
[58] Field of Search ..................... 427/386, 434 B, 58, 427/96; 174/68.5; 428/413, 417, 901

[56] References Cited

U.S. PATENT DOCUMENTS

| | | | |
|---|---|---|---|
| 3,306,872 | 2/1967 | Maycock et al. | 260/32.8 |
| 3,480,471 | 11/1969 | Rembold | 427/386 |
| 3,679,465 | 7/1972 | Flynn | 427/386 |
| 3,687,894 | 9/1972 | Collings et al. | 260/831 X |
| 3,738,862 | 6/1973 | Klarquist et al. | 427/386 |
| 3,998,983 | 12/1976 | Smith | 427/386 X |
| 4,075,260 | 2/1978 | Tsen et al. | 427/386 X |

FOREIGN PATENT DOCUMENTS

| | | | |
|---|---|---|---|
| 1434889 | 5/1976 | United Kingdom | 427/386 |

*Primary Examiner*—Ronald H. Smith
*Assistant Examiner*—Thurman K. Page
*Attorney, Agent, or Firm*—J. G. Carter

[57] ABSTRACT

The preparation of substrates impregnated with epoxy resins and curing agents therefor is improved by employing as the epoxy resin one which has been prepared by reacting a low equivalent weight epoxy resin such as a diglycidyl ether of bisphenol A with a dihydric phenolic compound such as tetrabromo bisphenol A in the presence of a quaternary ammonium hydroxide such as tetramethyl ammonium hydroxide.

7 Claims, No Drawings

PROCESS FOR PREPARING RESIN IMPREGNATED SUBSTRATES FOR USE IN PREPARING ELECTRICAL LAMINATES

FIELD OF THE INVENTION

Electrical laminates have been prepared from substrates impregnated with epoxy resins and curing agents therefor employing as the epoxy resin one which has been prepared from a diglycidyl ether and a dihydric phenolic compound employing as a catalyst a phosphonium compound. Electrical laminates when prepared from such substrates often fail the pressure cooker-solder test. It has now been unexpectedly discovered that when the phosphonium catalyst is replaced by an ammonium hydroxide catalyst that the resultant electrical laminates pass the pressure cooker-solder test and the glass transition temperature is increased as well as an improvement in one or more physical properties of the electrical laminates.

SUMMARY OF THE INVENTION

The present invention pertains to an improvement in a process for preparing resin impregnated substrates for use in preparing electrical laminates which comprises:
 (I) saturating said substrate with a resin forming mixture comprising;
  (A) an epoxy resin having an epoxide equivalent weight of from about 300 to about 600, preferably from about 375 to about 475 which has been prepared by reacting
   (1) a glycidyl ether of a dihydric phenol having an average of more than one epoxide group per molecule and an epoxide equivalent weight (EEW) of from about 156 to about 400, preferably from about 177 to about 190, with
   (2) a dihydric phenolic compound in the presence of
   (3) a catalyst for effecting the reaction between 1 and 2;
  (B) a curing agent for said epoxy resin and
  (C) a solvent system for Components A and B;
 (II) heating the resultant impreganted substrate to B-stage the resin and remove the solvent system; the improvement which comprises employing as the catalyst Component (A-3) a quaternary ammonium hydroxide.

DETAILED DESCRIPTION OF THE PREFERRED EMBODIMENTS

Suitable glycidyl ethers of a dihydric phenol which can be employed in the present invention include those represented by the formula

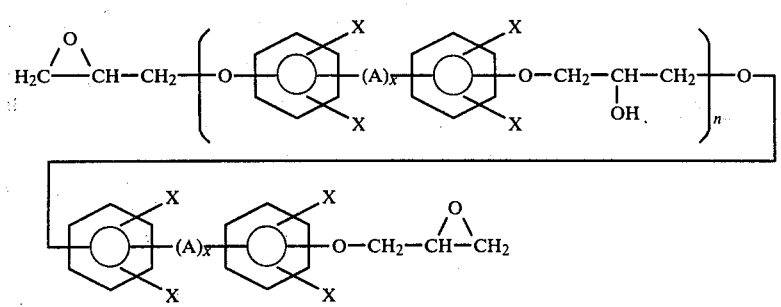

wherein A is a divalent hydrocarbon group having from 1 to about 8 carbon atoms, —S—, —S—S—, —O—,

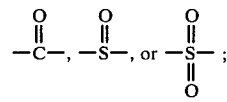

each X is independently hydrogen, chlorine or bromine; x has a value of zero or one and n has a value such that the EEW is from about 156 to about 400 preferably from about 177 to about 190.

Particularly suitable are the diglycidyl ethers of bisphenol A and tetrabromobisphenol A.

Suitable dihydric phenolic compounds include, for example, catechol, hydroquinone, resorcinol and bisphenols such as those represented by the formula

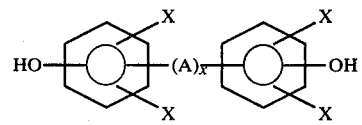

wherein X, A and x are as defined above.

Particularly suitable dihydric phenolic compounds are bisphenol A and tetrabromo bisphenol A.

The dihydric phenol and the glycidyl ether of a dihydric phenol are employed in quantities such that the phenolic OH:epoxide equivalent ratio is from about 0.2:1 to about 0.35:1 preferably from about 0.24:1 to about 0.31:1.

Suitable quaternary ammonium hydroxides include, for example, those represented by the formula

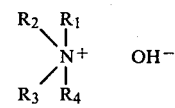

wherein each $R_1$, $R_2$, $R_3$, and $R_4$ are independently a hydrocarbon group having from 1 to about 10 carbon atoms. Particularly suitable quaternary ammonium hydroxides include, for example, tetramethyl ammonium hydroxide and benzyl trimethyl ammonium hydroxide, The quaternary ammonium hydroxide catalyst is employed in quantites of from about 0.005% to about 0.30% preferably from about 0.01% to about 0.10% by weight of the combined weight of the glycidyl ether of a dihydric phenol and the dihydric phenolic compound.

Suitable curing agents include, for example, guanidines such as dicyandiamide and tetramethyl guanidine and biguanides such as 2,6-xylene biguanide.

The curing agent is employed in quantities of from about 2 to about 8 preferably from about 3 to about 4 parts by weight per 100 parts or resin solids.

Suitable solvents include, for example, the oxygenated solvents such as acetone, methylethyl ketone, cyclohexanone, diacetone alcohol, mixtures thereof and the like, and the glycol ethers such as ethylene glycol, ethyl ether acetate; ethylene glycol, methyl ether; ethylene glycol, n-butyl ether; diethylene glycol, ethyl ether; diethylene glycol, n-butyl ether; propylene glycol, methyl ether; dipropylene glycol, methyl ether; mixtures thereof and the like and in admixture with aromatic solvents such as, for example, xylene, toluene, ethylbenzene and the like. Other suitable solvents include the halogenated solvents such as trichloroethylene, methylene chloride and the like and dimethyl formamide and the like.

The solvents are usually employed in quantities of from about 30 to about 80 preferably from about 40 to about 60 percent by weight based upon the total formulation.

Other components which can be included are accelerators such as, for example, imidazoles, benzyl dimethylamine, metaphenylene diamine, N,N,N',N'-tetramethyl-1-3-butanediamine and the like.

The accelerators are usually employed in quantities of from about 0.05 to about 1.0 preferably from about 0.1 to about 0.6 parts by weight per 100 parts resin solids.

Other components include wetting agents, colorants, fillers and the like.

Suitable substrates include, for example, fiberglass, polyester, and the like in woven or mat form.

The following examples are illustrative of the present invention and are not to be construed as to limiting the scope thereof in any manner.

PREPARATION OF EPOXY RESINS

EPOXY RESIN A

An epoxy resin was prepared by reacting 73 g (.39 equiv.) of a diglycidyl ether of bisphenol A having an EEW of 187 with 27 g (0.10 equiv.) of tetrabromo bisphenol A in the presence of .075 g of tetramethylammonium hydroxide at a temperature of 170° C. for 120 minutes. The resultant epoxy resin had an EEW of 440.

EPOXY RESIN B

An epoxy resin was prepared by reacting 66 g (0.353 equiv.) of a diglycidyl ether of bisphenol A having an EEW of 187 with 34 g (0.125 equiv.) of tetrabromo bisphenol A in the presence of 0.02 g of ethyl triphenyl phosphonium acetate acetic acid complex at a temperature of 160° C. for 120 minutes. The resultant resin had an EEW of 440.

The resin solutions also called prepreg varnish had the following compositions.

|  | EXAMPLE 1 | COMPARATIVE EXPERIMENT A |
|---|---|---|
| EPOXY RESIN A, grams | 4848.0 | — |
| EPOXY RESIN B, grams | — | 4343.0 |
| dicyandiamide, grams | 140.0 | 130.0 |
| benzyl dimethylamine, grams | 12.0 | 10.8 |
| acetone | 1484.0 | 2097.0 |
| methylether of ethylene glycol, grams | 1091.0 | 977.0 |
| Viscosity of solution at 25° C. | 55 cps | 52 cps |

PREPARATION OF LAMINATES

Fiberglass cloth was impregnated by passing it through the prepreg varnish, followed by a pair of doctor bars set at 15 mils clearance to control resin pickup, and finally through an oven at 300° F. for a dwell time of approximately 4 minutes. The resulting B-staged impregnated cloth or prepreg had a gel time of 70 to 90 seconds at 175° C.

Laminates were then prepared from each of the above prepared preimpregnated fiberglass employing 5 plys of 12 in.×12 in. ×0.013 in. (3 cm×3 cm×0.33 mm) sheets of 7637 style glass with single plys of 7628 style glass on the outsides, all of which were I617 finish. The laminates were prepared by pressing at 500 psig (3500 kg/cm$^2$) for 60 minutes at 175° C. The laminates were then tested. The results of the tests are given in Table I with the laminates prepared from Example 1 designated as laminate 1 while those prepared from Comparative Experiment A are designated as laminate A.

The pressure cooker-solder test was conducted by cutting 2 in×4 in coupons from prepared laminates, placing coupons edgewise on a rack in a pressure cooker and maintaining 15 pounds steam pressure for one hour, allowing coupons to equilibrate to ambient conditions for 30 minutes, and then immersing in 500° F. solder for 20 seconds. The laminates must be free blister after immersion in hot solder.

|  | Laminate 1 | Laminate A |
|---|---|---|
| Glass Transition Temp. (Tg) °C. | 118° C. | 113° C. |
| Flexural Strength, psi | 80,638 | 76,185 |
| Flexural Modulus, psi | 3.725 × 10$^6$ | 3.3 × 10$^6$ |
| Tensile Strength, psi | 56,648 | 60,577 |
| Tensile Modulus, psi | 4.03 × 10$^6$ | 4.04 × 10$^6$ |
| Copper Peel Strength (lbs/in) | 9.6 | 10.4 |
| Volume Resistivity (L-cm) | 1.0 × 10$^{15}$ | 1.0 × 10$^{15}$ |
| Disipation Factor, Condition A, 10$^5$ cycles | .00580 | .00900 |
| Dielectric Constant, Condition A, 10$^5$ cycles | 3.9095 | 4.2025 |
| Pressure-Cooker-Solder Test |  |  |
| Coupon No. 1 | Pass | Fail |
| Coupon No. 2 | Pass | Fail |
| Coupon No. 3 | Pass | Fail |
| Coupon No. 4 | Pass | Fail |
| Coupon No. 5 | Pass | Fail |
| Coupon No. 6 | Pass | Fail |
| Coupon No. 7 | Pass | Fail |
| Coupon No. 8 | Pass | Fail |

I claim:
1. In a process for preparing resin impregnated substrates for use in preparing electrical laminates which process comprises:
 (I) saturating said substrate with a resin forming mixture comprising;
   (A) an epoxy resin having an epoxide equivalent weight of from about 300 to about 600, which has been prepared by reacting
     (1) a glycidyl ether of a dihydric phenol having an average of more than one epoxide group per molecule and an epoxide equivalent weight (EEW) of from about 156 to about 400, with
     (2) a dihydric phenolic compound in the presence of
     (3) a catalyst for effecting the reaction between 1 and 2;

(B) a curing agent for said epoxy resin and
(C) a solvent system for Components A and B; and
(II) heating the resultant impregnated substrate to B-stage the resin and remove the solvent system; the improvement which comprises employing as the catalyst a quaternary ammonium hydroxide.

2. The process of claim 1 wherein Component (A-1) has an EEW of from about 170 to about 200 and Components (A-1) and (A-2) are employed in quantities such that the phenolic hydroxyl to epoxide equivalent ratio is from about 0.2:1 to about 0.35:1.

3. The process of claim 2 wherein Component (A-1) has an EEW of from about 180 to about 195 and Components (A-1) and (A-2) are employed in quantities such that the phenolic hydroxyl to epoxide equivalent ratio is from about 0.24:1 to about 0.31:1.

4. The process of claim 3 wherein Component (A-1) is a diglycidyl ether of bisphenol A, Component (A-2) is tetrabromo bisphenol A and Component (A-3) is a quaternary ammonium hydroxide represented by the formula

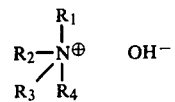

where is $R_1, R_2, R_3,$ and $R_4$ are independently a hydrocarbon group having from 1 to about 10 carbon atoms.

5. The process of claim 4 wherein Component (A-3) is tetramethyl ammonium hydroxide.

6. The process of claim 4 wherein Component (A-3) is benzyl trimethyl ammonium hydroxide.

7. A resin impregnated substrate prepared by the process of claims 1, 2, 3, 4, 5 or 6.

* * * * *